(12) United States Patent
Wu et al.

(10) Patent No.: US 10,417,348 B2
(45) Date of Patent: Sep. 17, 2019

(54) METHOD FOR PROCESSING AND LOADING WEB PAGES SUPPORTING MULTIPLE LANGUAGES AND SYSTEM THEREOF

(71) Applicant: HANGZHOU HIKVISION DIGITAL TECHNOLOGY CO., LTD., Hangzhou, Zhejiang (CN)

(72) Inventors: Yang Wu, Zhejiang (CN); Yanming Shi, Zhejiang (CN); Peng Wan, Zhejiang (CN); Xiao Xiang, Zhejiang (CN); Xiaoyuan Zhang, Zhejiang (CN)

(73) Assignee: HANGZHOU HIKVISION DIGITAL TECHNOLOGY CO., LTD., Hangzhou, Zhejiang (CN)

( * ) Notice: Subject to any disclaimer, the term of this patent is extended or adjusted under 35 U.S.C. 154(b) by 366 days.

(21) Appl. No.: 15/184,652

(22) Filed: Jun. 16, 2016

(65) Prior Publication Data

US 2016/0299888 A1  Oct. 13, 2016

Related U.S. Application Data

(62) Division of application No. 14/404,791, filed as application No. PCT/CN2012/084784 on Nov. 16, 2012, now abandoned.

(30) Foreign Application Priority Data

Jun. 1, 2012  (CN) .......................... 2012 1 0182827

(51) Int. Cl.
*G06F 17/28* (2006.01)
*G06F 16/958* (2019.01)
(Continued)

(52) U.S. Cl.
CPC ........ *G06F 17/289* (2013.01); *G06F 16/2282* (2019.01); *G06F 16/958* (2019.01);
(Continued)

(58) Field of Classification Search
CPC ...................................... G06F 17/289
(Continued)

(56) References Cited

U.S. PATENT DOCUMENTS 7,784,026 B1 * 8/2010 Wong ...................... G06F 9/454
                                                        717/109
8,145,993 B2   3/2012 Agarwal
(Continued)

FOREIGN PATENT DOCUMENTS

CN   101441623   5/2009
CN   102103494   6/2011
(Continued)

OTHER PUBLICATIONS

Bos, The XML Data Model, W3C, Aug. 17, 2005, p. 1-5, retrieved from https://www.w3.org/XML/Datamodel.html (Year: 2005).*
(Continued)

*Primary Examiner* — Frank D Mills
(74) *Attorney, Agent, or Firm* — Hamre, Schumann, Mueller & Larson, P.C.

(57) ABSTRACT

The present invention relates to the application field of computer networks, and disclosed are a method for processing and loading a web page supporting multiple languages and a system thereof, so as to reduce time and cost of labor investment when some language is added or modified, save storage capacity of a web page server, increase the speed of page loading and translation rendering, and reduce the redundancy of a translation file set. The present invention is based on a tree-shaped translation file set, where each hypertext markup language (HTML) has a corresponding
(Continued)

translation file. The method includes the following steps: scanning all translation files in a translation file set; extracting a same language string in different translation files or in different node sets of a same translation file, and inserting the same language string into a minimum common ancestor translation file of the different translation files or a common node set of the same translation file; deleting the same language string from the original translation files or node sets.

8 Claims, 5 Drawing Sheets

(51) Int. Cl.
  *G06F 17/22* (2006.01)
  *H03M 7/30* (2006.01)
  *G06F 16/22* (2019.01)
(52) U.S. Cl.
  CPC ........ *G06F 16/986* (2019.01); *G06F 17/2229* (2013.01); *G06F 17/2247* (2013.01); *G06F 17/2288* (2013.01); *H03M 7/3088* (2013.01); *H03M 7/707* (2013.01)
(58) Field of Classification Search
  USPC .......................................................... 715/239
  See application file for complete search history.

(56) References Cited

U.S. PATENT DOCUMENTS

| | | | |
|---|---|---|---|
| 8,265,924 B1* | 9/2012 | Cutler | G06F 17/2809 |
| | | | 704/8 |
| 8,719,693 B2 | 5/2014 | Borean | |
| 8,751,925 B1* | 6/2014 | Zhang | G06F 17/227 |
| | | | 715/234 |
| 9,128,918 B2 | 9/2015 | Travieso | |
| 2002/0123878 A1 | 9/2002 | Menke | |
| 2002/0152063 A1 | 10/2002 | Tokieda | |
| 2003/0005159 A1 | 1/2003 | Kurnhyr | |
| 2003/0074481 A1 | 4/2003 | Fox | |
| 2003/0084401 A1 | 5/2003 | Abel | |
| 2004/0044518 A1* | 3/2004 | Reed, Jr. | G06F 17/243 |
| | | | 704/8 |
| 2004/0049374 A1 | 3/2004 | Breslau | |
| 2004/0254781 A1 | 12/2004 | Appleby | |
| 2005/0043938 A1 | 2/2005 | Viken | |
| 2006/0136193 A1 | 6/2006 | Lux-Pogodalla | |
| 2008/0221864 A1* | 9/2008 | Blumenthal | G06F 17/28 |
| | | | 704/4 |
| 2009/0222787 A1* | 9/2009 | Aldahleh | G06F 9/454 |
| | | | 717/101 |
| 2009/0327866 A1 | 12/2009 | Li | |
| 2012/0005571 A1 | 1/2012 | Tang | |
| 2012/0072201 A1* | 3/2012 | Chen | G06F 17/2827 |
| | | | 704/2 |
| 2013/0226555 A1* | 8/2013 | Lerum | G06F 9/454 |
| | | | 704/2 |
| 2013/0227522 A1* | 8/2013 | Lerum | G06F 9/454 |
| | | | 717/120 |

FOREIGN PATENT DOCUMENTS

| | | |
|---|---|---|
| CN | 102103495 | 6/2011 |
| CN | 102402432 | 4/2012 |
| CN | 102402516 | 4/2012 |
| CN | 102693322 | 9/2012 |
| KR | 20040060858 | 7/2004 |

OTHER PUBLICATIONS

Anastasiou, D. "Survey on the Use of XLIFF in Localisation Industry and Academia;" Proceedings of Language Resource and Language Technology Standards—State of the Art, Emerging Needs, and Future Developments Workshop, 7th Intl. Conference on Language Resources and Evaluation, Malta, pp. 50-53, 2010. (Year: 2010).*

International search report for international application No. PCT/CN2012/084784, dated Mar. 7, 2013 (4 pages).

Vojislav Janjic, "Building a Multilingual PHP Website," found online at http://web.archive.org/web/20120511074335/http://www.phpbuilder.com/columns/MultilingualPHPSite/index.php3?, retrieved on May 13, 2015 (4 pages).

"Deflate," found online at http://en.wikipedia.org/w/index.php?title=DEFLATE&oldid=494744608, retrieved on May 13, 2015 (7 pages).

First Office Action issued for Chinese patent application No. 201210182827.X, dated Aug. 27, 2013 (10 pages, including English translation).

Second Office Action issued for Chinese patent application No. 201210182827.X, dated Mar. 17, 2014 (15 pages, including English translation).

Notification to Grant Patent Right for Invention issued for Chinese patent application No. 201210182827.X, dated Sep. 3, 2014 (3 pages, including English translation).

* cited by examiner

METHOD FOR PROCESSING AND LOADING WEB PAGES SUPPORTING MULTIPLE LANGUAGES AND SYSTEM THEREOF

TECHNICAL FIELD

The present invention relates to the application field of computer networks, especially relates to a technology of implementing web pages supporting multiple languages.

BACKGROUND

A necessary condition of internationalization is to design and develop products easily adapting to requirements of different areas. It requires that switching and displaying multiple language on the World Wide Web (referred to as "WWW") page can be conveniently implemented for the product accessed through networks. This kind of convenience includes two aspects:

1. Addition and maintenance of multiple language for a Web page;
2. The interactive experience when using Web page by users. The former requires that the method for processing a Web page supporting multiple languages needs to minimize the workload when adding a new language and maintaining existing language, and the latter requires the method has a higher response speed.

One of following three solutions is usually adopted by the prior art to implement the Web page supporting multiple language:

1. A HTML file is written for each language in each Web page, and the HTML (Hyper Text Makeup Language) file corresponding to one language is reloaded when the language is switched.
2. Each Web page corresponds to a HTML file and a translation file, the translation file is usually, but not limited to an extensible Markup Language (referred to as "XML") file (the following uses the XML file as the translation file for illustration), and a corresponding node set is built for every language in the XML file. Strings having difference with various languages (referred to as "language string" in the following) that are dynamically inserted using Web scripting codes or in the HTML file are extracted, and are associated with the strings of node sets for various languages in the XML file through index. Strings in the HTML file is replaced through index from the node set of corresponding language in the XML file, when loading a Web page or switching languages.
3. Each Web page has a corresponding HTML file, and a XML file is written for each language. Language strings in the HTML file are extracted and associated with the strings in respective XML file through index. The strings in the HTML file are replaced from the XML file of the corresponding language through index, when loading a Web page or switching language.

For the maintainability of the Web page supporting multiple languages: the solution 2 is better than the solution 1 while the solution 3 is better than the solution 2. For the responding speed when the user switches Web page language: the solution 2 and the solution 3 are better than the solution 1. The comparison between the solution 2 and the solution 3 is determined by the specific circumstances: both time complexity if traversing the algorithm are same, which both are square of the number of language strings(n) in the current Web page, and for the interactive speed of the Web front-end(browser) and the Web backend(server): the solution 2 only needs to obtain one HTML file and one XML file (or referred as XMLII) when loading a Web page and needs to obtain nothing when switching language; the solution 3 needs to obtain one HTML file and one XML file (or referred as XMLIII) when loading a Web page, and needs to obtain the XML file of another corresponding language (or referred as XMLIII') when switching language. When types of supported language(L) are fewer(L≤2), the file lengths of XMLII and XMLIII are similar, and the main factor of influencing user experiences is the interaction number of the Web front-end and the Web backend, so the solution 2 is better than the solution 3. When types of supported language (L) are many (L>2), the file length of XMLII is L times the file length of XMLIII, and the main factor of influencing the user experience is interaction time of the Web front-end and the Web backend. The solution 3 can bisect the interaction time when loading a new Web page to several time segments of every language switching, and the frequency for the user to switch languages again is much lower than the frequency for the user to load a new Web page, so the solution 3 is better than the solution 2.

With the internationalization of products, more and more types of language are required to be supported by Web pages, so at present the methods for implementing Web pages supporting multiple language mostly use the solution 3. However, the solution 2 and the solution 3 both have following defects:

1. Although the language strings in Web pages adopt a design of soft coding (i.e. HTML files and language strings are separated), the language supported by the product exists in the Web scripting code by way of hardcode. Therefore, the source code needs to be modified when each time a product supporting different language type sets is provided;
2. The presently known three solutions all take the ID properties of tags (referred to as "language tag" in the following) including language string in the HTML file as the index keys between the HTML file and the XML file. However, the ID properties of all tags in one HTML file are required not to be repeated by the World Wide Web Consortium standards, resulting in that the tags of the same language string displayed in different position of a HTML file have to be set with different position properties, and meanwhile repeated in the corresponding XML file multiple times;
3. The language string has to be stored in multiple corresponding XML, respectively, when multiple HTML files have the same language string;
4. For some Web pages in which the language strings are fewer and meanwhile have close relationships with each other (may be frequently switched by the user), one XML file has to be loaded at same time when each time loading a new HTML file, leading to increasing the pressure of interaction between the Web front-end and the backend;
5. When a user selects switching languages, the language string which is dynamically inserted into the Web page by the Web scripting code mode (referred to as "dynamic language string", indicating the language string that is not associated with the XML file node by the language tag in the HTML file) cannot be replaced, or the Web page can only be refreshed at the same time of switching languages.

In summary, the workload when adding a new language and maintaining existing language(s) and the redundancy among the languages are increased by above defect1, defect2 and defect 3; the response speed for the user to switch Web pages or languages is reduced by above defect4 and defect5.

SUMMARY OF THE INVENTION

The purpose of the present invention is to provide a method for processing and loading a web page supporting multiple languages, and a system thereof, which can reduce time and cost of labor investment when some language is added or modified, save storage capacity of a web page server, increase the speed of page loading and translation rendering, and reduce the redundancy of a translation file set.

To solve the above technical problems, one embodiment of the present invention discloses a method for processing a web page supporting multiple languages, based on a tree-shaped translation file set, where each hypertext markup language HTML file has a corresponding translation file, the method comprises the following steps: scanning all translation files in the translation file set; extracting the same language string in different translation files or in different node sets of a same translation file, and inserting the same language string into a minimum common ancestor translation file of the different translation files or a common node set of the same translation file; deleting the same language string from the original translation files or node sets.

Another embodiment of the present invention also discloses a method for loading a web page supporting multiple languages, based on a tree-shaped translation file set, where each hypertext markup language HTML file has a corresponding translation file, the method comprises the following steps:

Downloading a translation file corresponding to a current HTML file and all ancestor translation files corresponding to the translation file from a server;

Combining a language string in the translation file with the common language string in all the ancestor translation files of this translation file;

Inserting the combined language string into the language tag content of the HTML file or replacing the language tag content of the HTML file with the combined language string to display or switch multiple languages.

Another embodiment of the present invention also discloses a system for processing a web page supporting multiple languages, the system is based on a tree-shaped translation file set, where each hypertext markup language HTML file has a corresponding translation file, the system comprises the following modules:

A scanning module configured to scan all translation files in the translation file set;

An extracting module configured to extract the same language string in different translation files or in different node sets of a same translation file scanned by the scanning module;

An inserting module configured to insert the same language string extracted by the extracting module into a minimum common ancestor translation file of the different translation files or a common node set of the same translation file;

A deleting module configured to delete the same language string extracted by the extracting module from the original translation files or node sets.

Another embodiment of the present invention also discloses a system for loading a web page supporting multiple language, the system is based on a tree-shaped translation file set, where each hypertext markup language HTML file has a corresponding translation file, the system comprises the following modules:

A downloading module configured to download a XML file corresponding to a current HTML file and all ancestor translation files corresponding to the XML file from a server;

A combining module configured to combine a language string in the XML file downloaded by the downloading module with the common language string in all the ancestor XML files of this translation file;

A translation rendering module configured to insert the combined language string combined by the combining module to the language tag content of the HTML file or replacing the language tag content of the HTML file with the combined language string to display or switch multiple languages.

Compared to prior art, the main differences and effects of the embodiments of the present invention are:

By combining the same language string in different translation files or in different node sets of a same translation file into a minimum common ancestor translation file or a common node set of the same translation file, and deleting the same language string from the original translation files or node sets, the time and cost of labor investment is reduced when some language is added or modified, which can save the storage capacity of a web page server, increase the speed of page loading and translation rendering and reduce the redundancy of a translation file set.

By downloading from the server and combining the language string in a translation file corresponding to the current HTML file with common language string in all ancestor translation files of the translation file and translation rendering the combined language string, the storage capacity of a web page server can be saved, the speed of page loading and translation rendering is increased and the redundancy of a translation file set is reduced.

Furthermore, according to the language type supported in the web page processing which is queried from the language file, the language type set supported by a product and the default language are stored in a single XML file by way of soft coding, and the XML file set of respective language is stored in a respective folder. When each time it requires providing a product that supports different language type sets or different default languages, only the XML file needs to be modified and meanwhile the corresponding folder is removed or added, instead of modifying the Web page and the source code of the script.

Furthermore, by setting the tags with a same name property for the language strings having the same literal value, and then writing the name property into a key name of the same language strings, the name property of the tags can be taken as index when switching the web pages, so as to scan and search the same language strings in the extensible Markup Language (XML) file set in association and meanwhile further reduce the redundancy of the language strings in the XML file set.

Furthermore, by adopting a callback queue technology, only a few callback functions in the queue need to be executed when the user chooses to switch languages or load the web page, which improves the response speed of the webpage or the Web page when the user chooses to switch languages, and simultaneously solves the problem that dynamic language strings cannot be replaced when the user chooses to switch languages or the web page can only be refreshed at the same time of switching languages.

DETAILED DESCRIPTION OF THE PREFERRED EMBODIMENTS

Figure 1:
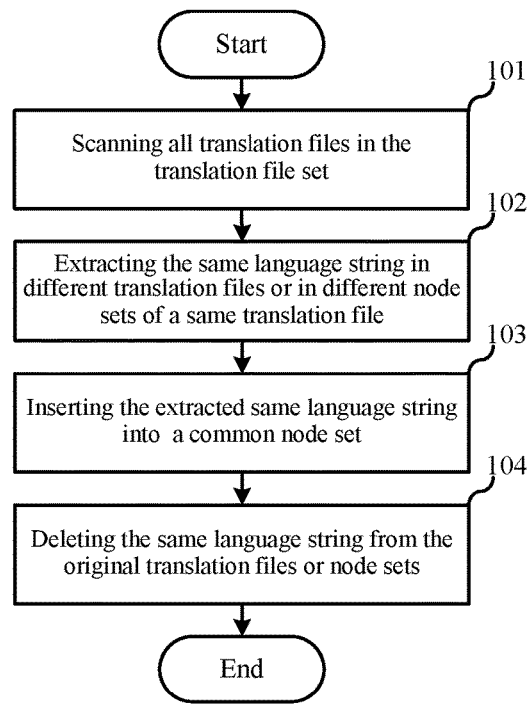
FIG. 1 illustrates a flow chart of a method for processing a web page supporting multiple languages according to the first embodiment of the present invention.

The following description provides plenty of technical details for readers to better understand this application. Those who skilled in the art will understand, however, these technical solutions required to be protected in the claims of the present invention can be practiced without many of these specific technical details and not based on all kinds of changes and modifications in following embodiments. The same reference numerals represent the same component or have the same meaning.

Embodiments of the present invention will be further described in detail so that the purpose, technical solution and advantages of the present invention will become clear.

The first embodiment of the present invention relates to a method for processing a web page supporting multiple languages. FIG. 1 is a flow chart of the method for processing a web page supporting multiple languages. The method for processing a web page supporting multiple languages is based on a tree-shaped translation file set, where each hypertext markup language HTML file has a corresponding translation file.

Specifically, as shown in FIG. 1, the method for processing a web page supporting multiple languages comprises the following steps:

In step 101, scanning all translation files in the translation file set.

Then proceeds to step 102, extracting the same language string in different translation files or in different node sets of a same translation file.

Then proceeds to step 103, inserting the extracted same language string into a minimum common ancestor translation file of the different translation files or a common node set of the same translation file.

Then proceeds to step 104, deleting the same language string from the original translation files or node sets.

And then, this flow is concluded.

By combining the same language string in different translation files or in different node sets of a same translation file into a minimum common ancestor translation file or a common node set of the same translation file and deleting the same string from the original translation files or node sets, the time and cost of labor investment is reduced when some language is added or modified, which can save the storage capacity of a web page server, increase the speed of page loading, and translation rendering, and reduce the redundancy of a translation file set.

When adding or modifying some language, e.g. there would have been 5000 strings which are given to the technical support or the translation company for translation, but 2000 of them may be repeated strings. Only 3000 of them need to be translated by people after using the processing method of the present invention.

Further, it is understood that the relationship between the Hyper Text Makeup Language (referred to as "HTML") file and the extensible Markup Language (referred to as "XML") file may be a one-to-one relationship, or may also be a multiple-to-one relationship. The "one-to-one" relationship between the HTML file and the XML file is: for some language, the language strings in one HTML file are stored in one corresponding translation file. The "multiple-to-one" relationship between the HTML file and the translation file is: for some language, the language strings in multiple HTML files are respectively stored in different node sets of the same one translation file.

In the present invention, the language string is the string that has difference with respective language in the Hyper Text Makeup Language file and needs to be replaced when switching languages of a web page, and also includes the string which is dynamically inserted into the page using web page script codes.

Figure 2:
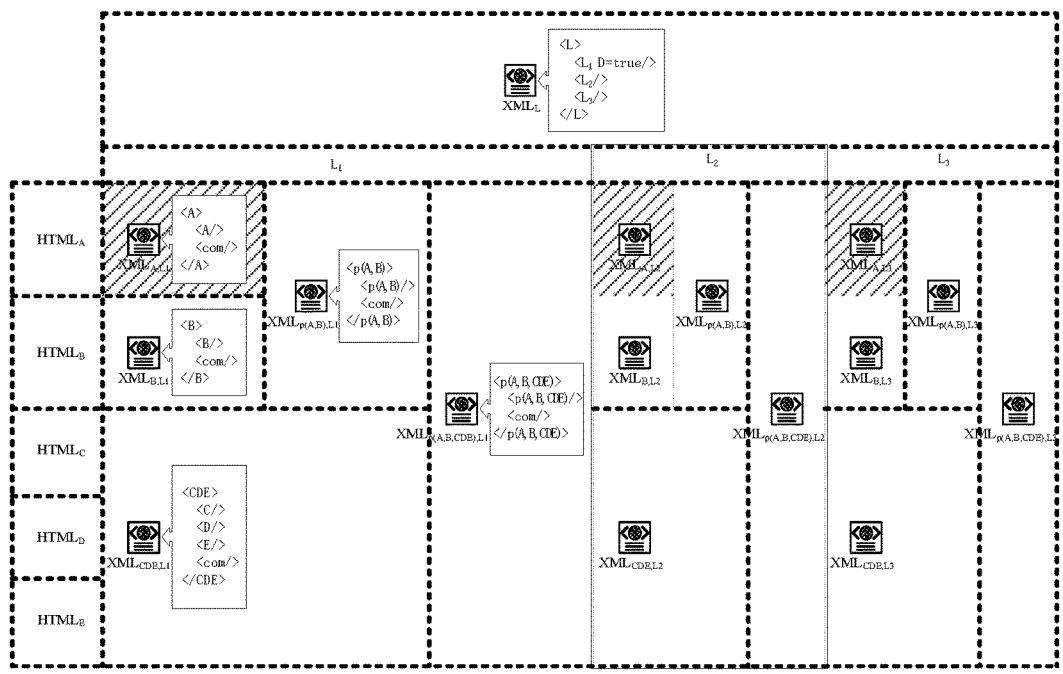
FIG. 2 illustrates the relationship between the language type, HTML files and XML files of the method for processing a web page supporting multiple languages.
Figure 3:
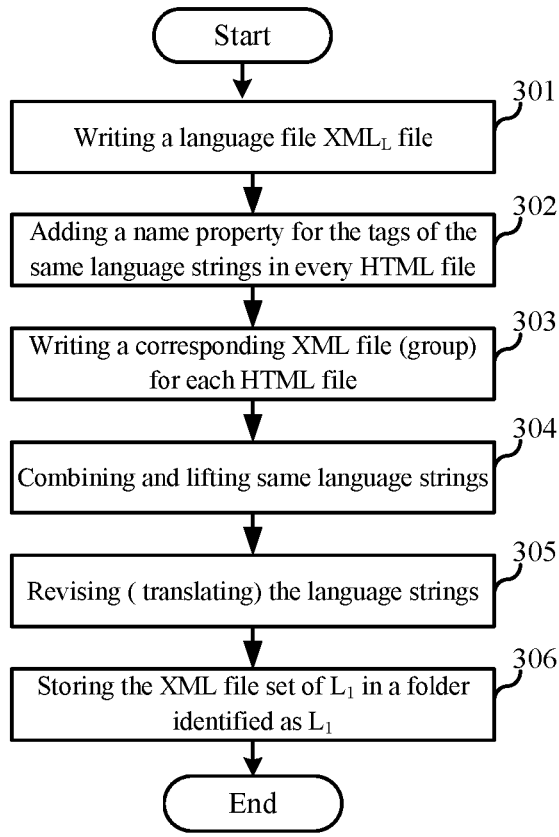
FIG. 3 illustrates a workflow chart of adding the first language supported by the Web page.
Figure 4:
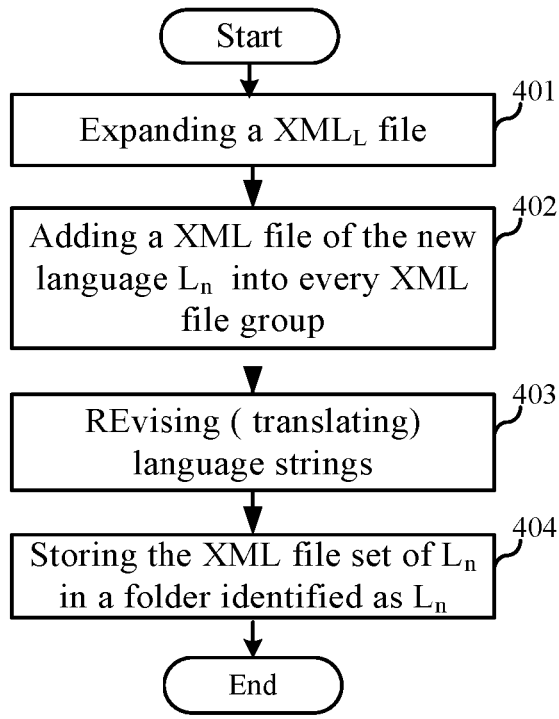
FIG. 4 illustrates a workflow chart of adding the second or nth language supported by the Web page.

The second embodiment of the present invention relates to a method for processing a web page supporting multiple languages. FIG. 2 illustrates the relationships between the language types, the HTML files and the XML files of the method for processing a web page supporting multiple languages, and FIG. 3 and FIG. 4 are flow charts of the method for processing a web page supporting multiple languages.

The second embodiment is improved based on the first embodiment, and the main improvement is: by corresponding one language type with one tree-shaped XML file set, the workload when adding a new language and maintaining the existing language can be reduced during the process of developing products. According to the language type supported in the web page processing which is queried from the language file, the language type set supported by a product and the default language are stored in a single XML file by way of soft coding, and the XML file set of respective language is stored in a respective folder. When each time it requires providing a product that supports different language type sets or different default languages, only the XML file needs to be modified and meanwhile the corresponding folder is removed or added, instead of modifying the Web page and the source code of the script. By setting the tags with a same name property for the language strings having the same literal value, and then writing the name property into the key names of the same language strings, the tags can be taken as index when switching the web pages, so as to scan and search the same language strings in the extensible Markup Language (XML) file set in association and meanwhile further reduce the redundancy of the language strings in the XML file set. By adopting a callback queue technology, only a few closures in the queue need to be executed when the user chooses to switch languages or load the web page, which improves the response speed of the webpage or the Web page when the user chooses to switch languages, and simultaneously solves the problem that dynamic language strings cannot be replaced when the user chooses to switch languages or the web page can only be refreshed at the same time of switching languages. Specifically:

A translation file is an extensible Markup Language (XML) file;

One tree-shaped extensible Markup Language (XML) file set corresponds to one language type.

The technical solution of the present invention is written by taking the extensible Markup Language (XML) file as a special case of the translation file. In the other embodiments of the present invention, the translation file can also be a translation file using JSON (a data exchange format for marking up data objects or arrays) or custom formats etc.

As a preferred embodiment of the present invention, as shown in FIG. 2, the language type $L_2$ corresponds to a tree-shaped extensible Markup Language (XML) file:

$\{XML_{X,L2} | X \in \{A, B, CDE, p(A,B), p(A,B,CDE)\}\}$○

The translation file is an extensible Markup Language (XML) file, and it further comprises the following steps before the step of scanning all translation files in the translation file set:

Querying a language type supported by a web page when the web page is switched from a language file, where the language file is used for storing a set of language types supported by a web page and a default language;

Choosing a corresponding tree-shaped extensible Markup Language (XML) file set according to the language type supported by the web page.

A translation file is an extensible Markup Language (XML) file, and it further comprises the following steps before the step of scanning all translation files in the translation file set:

Setting the tags corresponding to the HTML files containing the same strings in the XML files to have a same name property;

Writing the same name property into a key name of the same language strings.

Further, in short, it is understood that the operation of processing a Web page supporting multiple languages (or referred to as "combining and lifting") is the operation that deletes the same language strings among multiple XML files, and simultaneously just keeps one copy of the same language strings into a common node set of a common minimum ancestor XML file or a common ancestor of multiple XML files. Or it is the operation that deletes the same language strings among different node sets of a same XML file, and simultaneously just keeps one copy of the same language strings into a common node set or a common ancestor.

Comparing with the method that takes the ID property of the language tag in the Hyper Text Makeup Language (HTML) file as the index key between the HTML file and the extensible Markup Language (XML) file and does not perform combining and lifting operations in the existing technical solution 1 and technical solution 2, the method of the present invention takes the name property of the language tag in the HTML file as the index key between the HTML file and the XML file and performs the operation of processing a web page supporting multiple languages (or referred to as "combining and lifting"), so that the number of language strings requiring revision is significantly reduced when a web page of high capacity switches languages or web pages are loaded, and the redundancy r % among language strings is almost zero, i.e. there is nearly no same repeated language strings which need to be revised, where the reduced amount of the language strings requiring revision is related to the number of web pages or Web pages and the number of repeated strings between the internal Web page and the Web page, taking a web page product containing 30 HTML files as an example, r % being typically up to 20%-40%.

It further comprises the following steps after the step of deleting the same language string from the original translation files or node sets:

Pre-creating corresponding closures for respective code segments relating to dynamic language strings in the HTML files;

Compressing the closures into a pre-created callback queue to execute a code segment corresponding to respective closures in the callback queue according to a principle that the one entering the callback queue first is executed first, when a web page switches languages.

A callback queue CbQueue is created in the web page script codes, and if the web page (A) has a dynamic language string ($S^d_A$), then a code segment $CodeSeg_A$ related to $S^d_A$ is compressed into CbQueue in the form of the closure $Func_A$, and a contextual information of $CodeSeg_A$ is added as the property of $Func_A$ to ease the internal code calling of $Func_A$. All callback functions in CbQueue are sequentially executed in a queue order when a user switches languages, where the dynamic language string is the language string that is dynamically inserted to the web page by way of Web scripting codes.

As a preferred embodiment of the present invention, as shown in FIG. 3, the workflow of adding the first language supported by the Web page comprises the following steps:

In step 301, determining the first language $L_1$ supported by the Web page, writing a language file $XML_L$ file, and taking $L_1$ as a default language $L_D$.

Then proceeds to step 302, adding a name property for the tags of the same language strings in every HTML file.

Then proceeds to step 303, writing a corresponding XML file group for each HTML file (each XML file group has only one XML file as only one language is supported by the current Web page).

Then proceeds to step 304, combining and lifting same language strings.

Then proceeds to step 305, revising or translating the language strings, only revising the strings for the first language in this process, and mainly translating the strings for a second language and nth language in this process.

Then proceeds to step 306, storing the XML file set of $L_1$ in a folder identified as $L_1$, then ends this flow.

As another preferred embodiment of the present invention, as shown in FIG. 4, the workflow of adding the second language and nth language supported by the Web page comprises the following steps:

In step 401, expanding a language file $XML_L$ file based on the nth language $L_n$ supported by the Web page, and determining a default language.

Then proceeds to step 402, adding a XML file of the new language $L_n$ ($XML_{X,Ln}$) into every XML file group.

Then proceeds to step 403, revising or translating language strings. The combining and lifting operations do not need to be repeated when adding the second language and nth language $L_n$ as they have been performed when adding the first language supported by the Web page, and it only needs to translate the language strings of $L_2$ according to the existing XML file set of $L_1$. Therefore, the number of language strings which need to be translated will reduce r % (with respect to the existing technical solution 1 and technical solution 2).

Then proceeds to step 404, storing the XML file set of $L_n$ in a folder identified as $L_n$, then ends this flow.

Similarly, if it is discovered that a string S of some language ($L_n$) is wrong and needs to be modified in the process of maintaining a Web page, only one place in the XML where S exists needs to be modified, avoiding the problem of resulting in missing parts without modifications as S turns up in the multiple places of the Web page.

Figure 5:
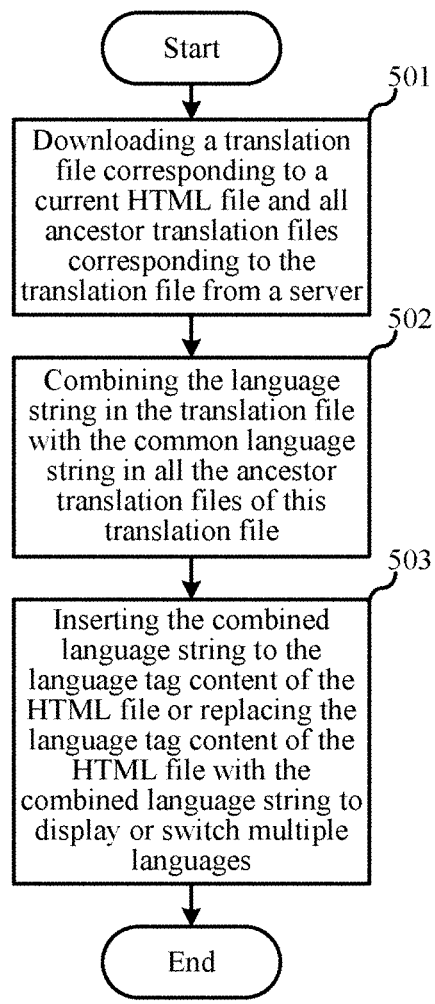
FIG. 5 illustrates a flow chart of a method for loading a web page supporting multiple languages according to the third embodiment of the present invention.

The third embodiment of the present invention relates to a method for loading a web page supporting multiple languages. FIG. 5 is a flow chart of the method for loading a web page supporting multiple languages. The method for loading a web page supporting multiple languages is based on a tree-shaped translation file set, where each hypertext markup language HTML file has a corresponding translation file.

Specifically, as shown in FIG. 5, the method for loading a web page supporting multiple languages comprises the following steps:

In step 501, downloading a translation file corresponding to a current HTML file and all ancestor translation files corresponding to the translation file from a server.

Then proceeds to step 502, combining a language string in the translation file with the common language string in all the ancestor translation files of this translation file.

Then proceeds to step 503, inserting the combined language string to the language tag content of the HTML file or replacing the language tag content of the HTML file with the combined language string to display or switch multiple languages.

Then ends this flow.

By downloading from the server and combining the language string in a translation file corresponding to the current HTML file with common language string in all ancestor translation files of the translation file and translation rendering the combined language string, the storage capacity of a web page server can be saved, the speed of page loading and translation rendering is increased and the redundancy of a translation file set is reduced.

Further, it is understood that the relationship between the Hyper Text Makeup Language (referred to as "HTML") file and the extensible Markup Language (referred to as "XML") file may be a one-to-one relationship, or may also be a multiple-to-one relationship. The "one-to-one" relationship between the HTML file and the XML file is: for some language, the language strings in one HTML file are stored in one corresponding translation file. The "multiple-to-one" relationship between the HTML file and the translation file is: for some language, the language strings in multiple HTML files are respectively stored in different node sets of the same one XML file.

In the present invention, the language string is the string that has difference with respective language in the Hyper Text Makeup Language file and needs to be replaced when switching languages of a web page, and also includes the string which is dynamically inserted into the page using web page script codes.

Here, a server may also be referred to as a web page server, and a client is a browser for browsing web pages when the server is referred to as a web page server.

The fourth embodiment of the present invention relates to a method for loading a web page supporting multiple languages.

The fourth embodiment is improved based on the third embodiment, the main improvement is: by corresponding one language type with one tree-shaped XML file set, the workload when adding a new language and maintaining the existing language can be reduced during the process of developing products. When switching web page languages or loading a web page, the property value of the tags having a same name property is taken as an index key, so as to scan and search the same language strings in the XML file set in association and meanwhile further reduce the redundancy of the language strings in the XML file set. By adopting a callback queue technology when loading a web page, only a few closures in the queue need to be executed, which improves the response speed of the webpage or the Web page when the user chooses to switch languages, and simultaneously solves the problem that dynamic language strings cannot be replaced when the user chooses to switch languages or the web page can only be refreshed at the same time of switching languages. Specifically:

A translation file is an extensible Markup Language (XML) file;

One tree-shaped extensible Markup Language (XML) file set corresponds to one language type.

It further comprises the following steps before the step of downloading a translation file corresponding to a current HTML file and all ancestor translation files corresponding to the translation file from a server:

Loading a language file, where the language file is used for storing a set of language types supported by a web page and a default language.

Querying a language type supported by a loaded web page in the language file.

Choosing a corresponding tree-shaped extensible Markup Language (XML) file set according to the language type supported by the web page.

A translation file is an extensible Markup Language (XML) file, and the step of combining a language string in the translation file with the common language string in all the ancestor translation files of this translation file comprises the following sub-steps:

Combining the XML file and all the ancestor XML files of the XML file into one document structure;

Scanning a key name of a language string in the combined document structure;

Inserting the scanned key name which is taken as index to the language tag content of the HTML file or replacing the language tag content of the HTML file with the scanned key name.

Further, it is understood that comparing with the method that takes the ID property of the language tag in the Hyper Text Makeup Language (HTML) file as the index key between the HTML file and the extensible Markup Language (XML) file and does not perform combining and lifting operations in the existing technical solution 1 and technical solution 2, the method of the present invention takes the name property of the language tag in the HTML file as the index key between the HTML file and the XML file and performs the operation of processing a web page supporting multiple languages (or referred to as "combining and lifting"), so that the number of language strings requiring revision is significantly reduced when a web page of high capacity switches languages or web pages are loaded, and the redundancy r % among language strings is almost zero, i.e. there is nearly no same repeated language strings which need to be revised, where the reduced amount of the language strings requiring revision is related to the number of web pages or Web pages and the number of repeated strings between the internal Web page and the Web page, taking a web page product containing 30 HTML files as an example, r % being typically up to 20%-40%.

The step of inserting the combined language string into the language tag content of the HTML file or replacing the language tag content of the HTML file with the combined language string to display or switch (or render) multiple languages comprises the following sub-steps:

Executing a code segment corresponding to respective closures in the callback queue according to a principle that the one entering the callback queue first is executed first, where the closure is created by a corresponding code segment related to a dynamic language string in the HTML file, and the callback queue can be empty.

As an another preferred embodiment of the present invention, a technical solution of the present invention is implemented by the following procedures:

1. A XML file ($XML_L$) is created to store the set of language types (CO supported by a product and a default language ($L_D$). The current language ($L_B$) of a browser is determined at first when a Web page accesses the product, and if $L_B \in C_L$, then $L_B$ is displayed as the default language of the Web page, otherwise $L_D$ is displayed as the default language of the Web page.

2. A corresponding XML file group is established according to the HTML file of the Web page, and each XML file in the group stores a string of one language ($L_1$, $L_1 \in C_L$), and the name property of the language tag in the HTML file is taken as the index key between the HTML file and the XML file. The XML files of the same language $L_1$ are stored to form one XML file set ($\{XML_{L1}\}$) and are stored in a folder identified as $L_1$.

3. Each XML file ($XML_A$) at least includes one node set ($XML_A$<A>) named after the present file name (A) and one common node set ($XML_A$<com>).

There is a hierarchical relationship among the XML files. At first, the present node set ($XML_{A,L1}$<A>) of the XML file ($XML_{A,L1}$) associated with the HTML file ($HTML_A$), the common node set ($XML_{A,L1}$<com>) of $XML_{A,L1}$, the common node set ($XML_{P(A),L1}$<com>) of the parent XML file ($XML_{P(A),L1}$) of $XML_{A,L1}$, the common node set ($XML_{P^2(A),L1}$<com>) of the grandparent XML file ($XML_{P^2(A),L1}$) of $XML_{A,L1}$, . . . and the common node set ($XML_{P^n(A),L1}$<com>) of the root parent XML file ($XML_{P^n(A),L1}$) of $XML_{A,L1}$ are combined into one XML document structure ($XMLDoc_{A,L1}$), when loading a Web page (A) or switching languages (the language is $L_1$), then strings in $HTML_A$ are searched and replaced from $XMLDoc_{A,L1}$ by the index key.

If $XML_A$ and $XML_B$ have a same ancestor ($XML_A$ and $XML_B$ may have the same level, also $XML_A$ and the ancestor of $XML_B$ may have the same level or $XML_B$ and the ancestor of $XML_A$ may have the same level, also $XML_A$ may be the ancestor of $XML_B$ or $XML_B$ may be the ancestor of $XML_A$) and $XML_A$ and $XML_B$ have the same strings $S_A$ and $S_B$, then the string $S_{AB}(S_{AB}=S_A=S_B)$ is added into the common node set ($XML_{P(AB)}$<com>) of the common minimum ancestor XML file ($XML_p(AB)$) of $XML_A$ and $XML_B$, and $S_A$ in $XML_A$ and $S_B$ in $XML_B$ are deleted (the operation is referred to as "combining and lifting" in the following).

4. It does not have to be one-to-one correspondent between the HTML files and the XML files (referred to as "one-to-one" relationship in the following), also multiple HTML files can associate with the same group of XML files (referred to as "multiple-to-one" relationship in the following). For example, three HTML files ($HTML_C$, $HTML_D$ and $HTML_E$) associate with a same group of XML files ($\{XML_{DE,L_i}|L_1 \in C_L\}$), and the language strings of $HTML_C$, $HTML_D$ and $HTML_E$ are stored in a node set $XML_{CDE}$<C>, a node set $XML_{CDE}$<D> and a node set $XML_{CDE}$<E> of $XML_{CDE}$, respectively. And at the same time, a common node set $XML_{CDE}$<com> is created in $XML_{CDE}$.

If $XML_{CDE}$<C> and $XML_{CDE}$<D> have same strings $S_C$ and $S_D$, then a string $S_{CD}(S_{CD}=S_C=S_D)$ is added into $XML_{CDE}$<com>, and $S_C$ in $XML_{CDE}$<C> and $S_D$ in $XML_{CDE}$<D> are deleted (the operation is referred to as "combining and lifting" in the following); if $XML_{CDE}$ and another XML file ($XML_F$) have a same ancestor, and $XML_{CDE}$ and $XML_F$ have same strings $S_{CDE}$ and $S_F$, then $S_{CDE}$ and $S_F$ are combined and lifted into a common node set $XML_{p(CDE,F)}$<com> of the common minimum ancestor XML file ($XML_{p(CDE,F)}$) of $XML_{CDE}$ and $XML_F$.

5. A callback queue CbQueue is created in the Web script codes, and if there is a dynamic language string $S^d_A$ existing in the Web page (A), then the code segment $CodeSeg_A$ related to $S^d_A$ is compressed into CbQueue in the form of the closure $Func_A$, and a contextual information of the $CodeSeg_A$ is added as the property of $Func_A$ to ease the internal code calling of $Func_A$. All closures in CbQueue are sequentially executed in a queue order when a user switches languages.

As shown in FIG. 2, a language type set includes three language types ($C_L=\{L_1,L_2,L_3\}$), where $L_1$ is a default language; there are five Web pages (five HTML files, $HTML_A$~$HTML_E$), and three XML files ($\{XML_{A,Li}|L_1 \in C_L\}$) marked in diagonal stripes background in FIG. 1 form one XML file group described in technical solution 2, where $HTML_A$ and $HTML_B$ have a "one-to-one" relationship with their respectively corresponding XML file groups ($\{XML_{A,Li}\}$, $\{XML_{B,Li}\}$), and $HTML_C$, $HTML_D$ and $HTML_E$ have a "multiple-to-one" relationship with their common XML file group($\{XML_{CDE,Li}|L_1 \in C_L\}$); five XML files($\{XML_{X,L2}|X \in \{A,B,CDE,p(A,B),p(A,B,CDE)\}\}$) surrounded by solid-line frames in FIG. 1 form one XML file set described in technical solution 2, where the file sets $\{XML_{X,L1}\}$, $\{XML_{X,L2}\}$ and $\{XML_{X,L3}\}$ are stored in folders identified as $L_1$, $L_2$ and $L_3$, respectively.

Taking language $L_1$ as an example, a file set $\{XML_{X,L1}\}$ includes a total of three levels. Where, $XML_{p(A,B),L1}$ is parent XML of $XML_A$ and $XML_B$, $XML_B$, $XML_{p(A,B,CDE),L1}$ is parent XML of $XML_{p(A,B),L1}$ and $XML_{CDE}$. The common node sets ($XML_{A,L1}$<com> and $XML_{B,L1}$<com>) of leaf XMLs($XML_{A,L1}$ and $XML_{B,L1}$) having a "one-to-one" relationship are empty sets Ø. Non-common node sets ($XML_{p(A,B),L1}$<p(A,B)> and $XML_{p(A,B,CDE),L1}$<p(A,B,CDE)>) of non-leaf XMLs($XML_{p(A,B),L1}$ and $XML_{p(A,B,CDE),L1}$) may be Ø or not Ø. Taking $XML_{p(A,B),L1}$ as an example, $XML_{p(A,B),L1}$ corresponds to $HTML_{AB}$ when there is a main frame and $HTML_A$ and $HTML_B$ are taken as the inter-related frames iframe containing another document in $HTML_{AB}$ or when $HTML_{AB}$ is dynamically inserted by using Asynchronous JavaScript and XML (referred to as "Ajax") between browsers and the Web server, that is, $XML_{p(A,B),L1}$<p(A,B)> stores the language strings of $XML_{p(A,B),L1}$, in this time $XML_{p(A,B),L1}$<p(A,B)>≠Ø. When $XML_A$ and $XML_B$ are taken as separate documents, $XML_{p(A,B),L1}$<p(A,B)>=Ø, and $XML_{p(A,B),L1}$ is only taken as a virtual level XML file for storing the strings combined and lifted from $XML_A$ and $XML_B$. The virtual level XML file is not recommended to keep unless it is taken as a root parent XML file.

Taking language $L_1$ as an example, the combining and lifting relationship (represented by the symbol "}⇒") among XML is:

$$\left. \begin{array}{l} XML_{A,L1}\langle A\rangle \\ XML_{B,L1}\langle B\rangle \end{array} \right\} \Rightarrow XML_{p(A,B),L1}\langle com\rangle$$

$$\left. \begin{array}{l} XML_{A,L1}\langle A\rangle \\ XML_{p(A,B),L1}\langle p(A,B)\rangle \end{array} \right\} \Rightarrow XML_{p(A,B),L1}\langle com\rangle$$

-continued $$\left.\begin{array}{l}XML_{A,L1}\langle A\rangle\\ XML_{CDE,L1}\langle C\rangle\end{array}\right\} \Rightarrow XML_{p(A,B,CDE),L1}\langle com\rangle$$

$$\left.\begin{array}{l}XML_{p(A,B),L1}\langle p(A,B)\rangle\\ XML_{CDE,L1}\langle C\rangle\end{array}\right\} \Rightarrow XML_{p(A,B,CDE),L1}\langle com\rangle$$

$$\left.\begin{array}{l}XML_{A,L1}\langle A\rangle\\ XML_{p(A,B,CDE),L1}\langle p(A,B,CDE)\rangle\end{array}\right\} \Rightarrow XML_{p(A,B,CDE),L1}\langle com\rangle$$

$$\left.\begin{array}{l}XML_{p(A,B),L1}\langle p(A,B)\rangle\\ XML_{p(A,B,CDE),L1}\langle p(A,B,CDE)\rangle\end{array}\right\} \Rightarrow XML_{p(A,B,CDE),L1}\langle com\rangle$$

$$\left.\begin{array}{l}XML_{CDE,L1}\langle C\rangle\\ XML_{p(A,B,CDE),L1}\langle p(A,B,CDE)\rangle\end{array}\right\} \Rightarrow XML_{p(A,B,CDE),L1}\langle com\rangle$$

etc.

Combining and lifting among XML can not only be performed between two XML, but also can be performed among multiple XML, for example (among three XML):

$$\left.\begin{array}{l}XML_{A,L1}\langle A\rangle\\ XML_{B,L1}\langle B\rangle\\ XML_{p(A,B),L1}\langle p(A,B)\rangle\end{array}\right\} \Rightarrow XML_{p(A,B),L1}\langle com\rangle$$

$$\left.\begin{array}{l}XML_{A,L1}\langle A\rangle\\ XML_{P(A,B),L1}\langle p(A,B)\rangle\\ XML_{p(A,B,CDE),L1}\langle p(A,B,CDE)\rangle\end{array}\right\} \Rightarrow XML_{p(A,B,CDE),L1}\langle com\rangle$$

$$\left.\begin{array}{l}XML_{A,L1}\langle A\rangle\\ XML_{B,L1}\langle B\rangle\\ XML_{CDE,L1}\langle C\rangle\end{array}\right\} \Rightarrow XML_{p(A,B,CDE),L1}\langle com\rangle$$

$$\left.\begin{array}{l}XML_{A,L1}\langle A\rangle\\ XML_{p(A,B),L1}\langle p(A,B)\rangle\\ XML_{CDE,L1}\langle C\rangle\end{array}\right\} \Rightarrow XML_{p(A,B,CDE),L1}\langle com\rangle$$

$$\left.\begin{array}{l}XML_{A,L1}\langle A\rangle\\ XML_{CDE,L1}\langle C\rangle\\ XML_{p(A,B,CDE),L1}\langle p(A,B,CDE)\rangle\end{array}\right\} \Rightarrow XML_{p(A,B,CDE),L1}\langle com\rangle$$

$$\left.\begin{array}{l}XML_{p(A,B),L1}\langle p(A,B)\rangle\\ XML_{CDE,L1}\langle C\rangle\\ XML_{p(A,B,CDE),L1}\langle p(A,B,CDE)\rangle\end{array}\right\} \Rightarrow XML_{p(A,B,CDE),L1}\langle com\rangle$$

etc.

The method embodiments of this invention all can be implemented by software, hardware and firmware etc. No matter this invention is implemented by software, or hardware, or firmware, instruction codes all can be stored in the memory (such as permanent or revisable, volatile or non-volatile, solid or non solid, fixed or exchangeable media etc) that any type of computers can access. Likewise, the memory can be such as programmable array logic (PAL), random access memory (RAM), programmable read only memory (PROM), read-only memory (ROM), electrically erasable programmable ROM (EEPROM), floppy disc, optical disc, and digital versatile disc (DVD) etc.

Figure 6:
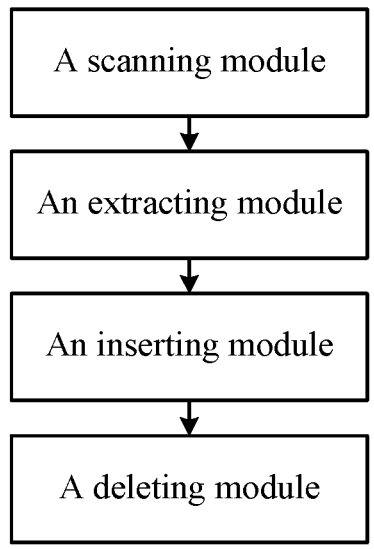
FIG. 6 illustrates a structure diagram of a system for processing a web page supporting multiple languages according to the fifth embodiment of the present invention.

The fifth embodiment of the present invention relates to a system for processing a web page supporting multiple languages. FIG. 6 is a structure diagram of the system for processing a web page supporting multiple languages. The system for processing a web page supporting multiple languages is based on a tree-shaped translation file set, where each hypertext markup language HTML file has a corresponding translation file, the system comprises following modules:

A scanning module configured to scan all translation files in the translation file set;

An extracting module configured to extract the same language string in different translation files scanned by the scanning module or in different node sets of a same translation file scanned by the scanning module;

An inserting module configured to insert the same language string extracted by the extracting module into a minimum common ancestor translation file of the different translation files or a common node set of the same translation file;

A deleting module configured to delete the same language string extracted by the extracting module from the original translation files or node sets.

By combining the same language string in different translation files or in different node sets of a same translation file into a minimum common ancestor translation file or a common node set of the same translation file and deleting the same string from the original translation files or node sets, the time and cost of labor investment is reduced when some language is added or modified, which can save the storage capacity of a web page server, increase the speed of page loading, and translation rendering, and reduce the redundancy of a translation file set.

Further, it is understood that the relationship between the Hyper Text Makeup Language (referred to as "HTML") file and the extensible Markup Language (referred to as "XML") file may be a one-to-one relationship, or may also be a multiple-to-one relationship. The "one-to-one" relationship between the HTML file and the XML file is: for some language, the language strings in one HTML file are stored in one corresponding XML file. The "multiple-to-one" relationship between the HTML file and the translation file is: for some language, the language strings in multiple HTML files are respectively stored in different node sets of the same XML file.

In the present invention, the language string is the string that has difference with respective language in the Hyper Text Makeup Language file and needs to be replaced when switching languages of a web page, and also includes the string which is dynamically inserted into the page using web page script codes.

The first embodiment is the method embodiment corresponding to this embodiment, and this embodiment and the first embodiment can be implemented in cooperation with each other. Correlated technical details disclosed in the first embodiment are still effective in this embodiment and will not be repeated here in order to reduce duplication. Correspondingly, correlated technical details disclosed in this embodiment can also be applied in the first embodiment.

Figure 7:
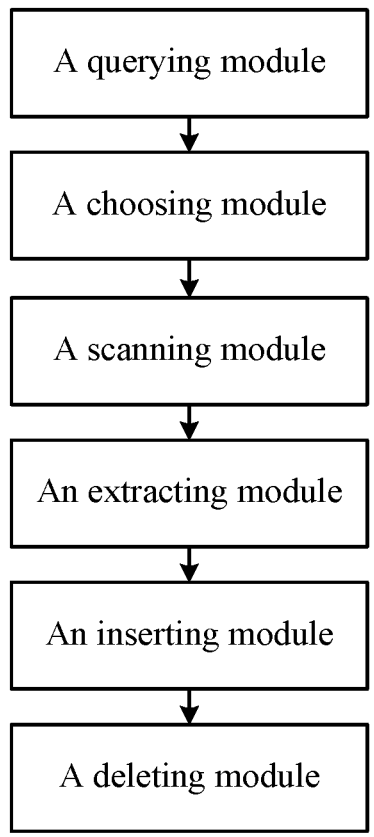
FIG. 7 illustrates a structure diagram of a system for processing a web page supporting multiple languages according to the sixth embodiment of the present invention.

The sixth embodiment of the present invention relates to a system for processing a web page supporting multiple languages. FIG. 7 is a structure diagram of the system for processing a web page supporting multiple languages.

The sixth embodiment is improved based on the fifth embodiment, the main improvement is: by corresponding one language type with one tree-shaped XML file set, the workload when adding a new language and maintaining the existing language can be reduced during the process of developing products. According to the language type supported in the web page processing which is queried from the language file, the language type set supported by a product and the default language are stored in a single XML file by way of soft coding, and the XML file set of respective language is stored in a respective folder. When each time it requires providing a product that supports different language type sets or different default languages, only the XML file needs to be modified and meanwhile the corresponding folder is removed or added, instead of modifying the Web page and the source code of the script.

Specifically:

A translation file is an extensible Markup Language (XML) file;

One tree-shaped extensible Markup Language (XML) file set corresponds to one language type.

The system for processing a web page supporting multiple language further comprises following modules:

A querying module configured to query a language type supported by a web page when the web page is switched from a language file, where the language file is used for storing a set of language types supported by a web page and a default language;

A choosing module configured to choose a corresponding tree-shaped extensible Markup Language (XML) file set according to the language types supported by the web page and queried by the querying module.

A translated file is an extensible Markup Language (XML) file, the system for processing a web page supporting multiple language further comprises the following modules:

A setting module configured to set the tags corresponding to the HTML files containing the same strings in the XML files to have a same name property;

A writing module configured to write the same name property set by the setting module into a key name of the same language strings.

Further, in short, it is understood that the operation of processing a Web page supporting multiple languages (or referred to as "combining and lifting") is the operation that deletes the same language strings among multiple XML files, and simultaneously just keeps one copy of the same language strings into a common node set of a common minimum ancestor XML file or a common ancestor of multiple XML files. Or it is the operation that deletes the same language strings among different node sets of a same XML file, and simultaneously just keeps one copy of the same language strings into a common node set or a common ancestor.

Comparing with the method that takes the ID property of the language tag in the Hyper Text Makeup Language (HTML) file as the index key between the HTML file and the extensible Markup Language (XML) file and does not perform combining and lifting operations in the existing technical solution 1 and technical solution 2, the method of the present invention takes the name property of the language tag in the HTML file as the index key between the HTML file and the XML file and performs the operation of processing a web page supporting multiple languages (or referred to as "combining and lifting"), so that the number of language strings requiring revision is significantly reduced when a web page of high capacity switches languages or web pages are loaded, and the redundancy r % among language strings is almost zero, i.e. there is nearly no same repeated language strings which need to be revised, where the reduced amount of the language strings requiring revision is related to the number of web pages or Web pages and the number of repeated strings between the internal Web page and the Web page, taking a web page product containing 30 HTML files as an example, r % being typically up to 20%-40%.

The system for processing a web page supporting multiple language further comprises following modules:

A queue module configured to pre-create corresponding closures for respective code segments relating to dynamic language strings in the HTML files and compress the closures into a pre-created callback queue;

A callback module configured to execute code segments corresponding to respective closures in the callback queue according to a principle that the one entering the callback queue first is executed at first, when a web page switches languages.

Further, it is understood that a callback queue CbQueue is created in the web page script codes, and if the web page (A) has a dynamic language string ($S^d_A$), then a code segment $CodeSeg_A$ related to $S^d_A$ is compressed into CbQueue in the form of the closure $Func_A$, and a contextual information of $CodeSeg_A$ is added as the property of $Func_A$ to ease the internal code calling of $Func_A$. All callback functions in CbQueue are sequentially executed in a queue order when a user switches languages, where the dynamic language string is the language string that is dynamically inserted to the web page by way of Web scripting codes.

The second embodiment is the method embodiment corresponding to this embodiment, and this embodiment and the second embodiment can be implemented in cooperation with each other. Correlated technical details disclosed in the first embodiment are still effective in this embodiment and will not be repeated here in order to reduce duplication. Correspondingly, correlated technical details disclosed in this embodiment can also be applied in the second embodiment.

Figure 8:
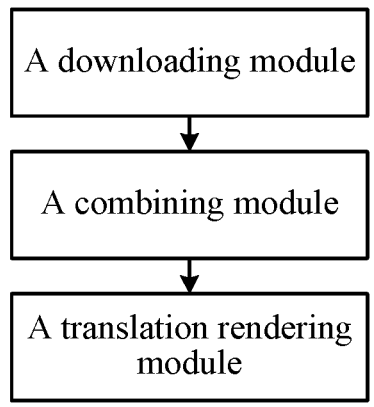
FIG. 8 illustrates a structure diagram of a system for loading a web page supporting multiple languages according to the seventh embodiment of the present invention.

The seventh embodiment of the present invention relates to a system for loading a web page supporting multiple languages. FIG. 8 is a structure diagram of the system for loading a web page supporting multiple languages. The system for loading a web page supporting multiple languages is based on a tree-shaped translation file set, where each hypertext markup language HTML file has a corresponding translation file.

The system including following modules:

A downloading module configured to download a XML file corresponding to a current HTML file and all ancestor XML files corresponding to the XML file from a server.

A combining module configured to combine the language string in the XML file downloaded by the downloading module with the common language string in all the ancestor XML files of the XML file.

A translation rendering module configured to insert the combined language string combined by the combining module to the language tag content of the HTML file or replacing the language tag content of the HTML file with the combined language string to display or switch multiple languages.

By downloading from the server and combining the language string in a XML file corresponding to the current HTML file with common language string in all ancestor XML files of the translation file and translation rendering the combined language string, the storage capacity of a web page server can be saved, the speed of page loading and translation rendering is increased and the redundancy of a XML file set is reduced.

Further, it is understood that the relationship between the Hyper Text Makeup Language (referred to as "HTML") file and the extensible Markup Language (referred to as "XML") file may be a one-to-one relationship, or may also be a multiple-to-one relationship. The "one-to-one" relationship between the HTML file and the XML file is: for some language, the language strings in one HTML file are stored in one corresponding translation file. The "multiple-to-one"

relationship between the HTML file and the translation file is: for some language, the language strings in multiple HTML files are respectively stored in different node sets of the same one XML file.

In the present invention, the language string is the string that has difference with respective language in the Hyper Text Makeup Language file and needs to be replaced when switching languages of a web page, and also includes the string which is dynamically inserted into the page using web page script codes.

Here, a server may also be referred to as a web page server, and a client is a browser for browsing web pages when the server is referred to as a web page server.

The third embodiment is the method embodiment corresponding to this embodiment, and this embodiment and the third embodiment can be implemented in cooperation with each other. Correlated technical details disclosed in the third embodiment are still effective in this embodiment and will not be repeated here in order to reduce duplication. Correspondingly, correlated technical details disclosed in this embodiment can also be applied in the third embodiment.

Figure 9:
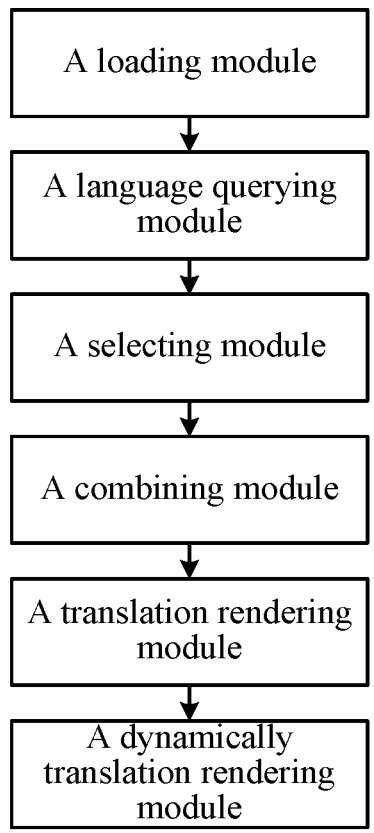
FIG. 9 illustrates a structure diagram of a system for loading a web page supporting multiple languages according to the eighth embodiment of the present invention.

The eighth embodiment of the present invention relates to a system for loading a web page supporting multiple languages. FIG. 9 is a structure diagram of the system for loading a web page supporting multiple languages.

The eighth embodiment is improved based on the seventh embodiment, the main improvement is: by corresponding one language type with one tree-shaped XML file set, the workload when adding a new language and maintaining the existing language can be reduced during the process of developing products. When switching web page languages or loading a web page, the property value of the tags having a same name property is taken as an index key, so as to scan and search the same language strings in the XML file set in association and meanwhile further reduce the redundancy of the language strings in the XML file set. By adopting a callback queue technology when loading a web page, only a few closures in the queue need to be executed, which improves the response speed of the webpage or the Web page when the user chooses to switch languages, and simultaneously solves the problem that dynamic language strings cannot be replaced when the user chooses to switch languages or the web page can only be refreshed at the same time of switching languages. Specifically:

One tree-shaped extensible Markup Language (XML) file set corresponds to one language type.

A callback queue CbQueue is created in the web page script codes, and if the web page (A) has a dynamic language string ($S^d_A$), then a code segment $CodeSeg_A$ related to $S^d_A$ is compressed into CbQueue in the form of the closure $Func_A$, and a contextual information of $CodeSeg_A$ is added as the property of $Func_A$ to ease the internal code calling of $Func_A$. All callback functions in CbQueue are sequentially executed in a queue order when a user switches languages, where the dynamic language string is the language string that is dynamically inserted to the web page by way of Web scripting codes.

As shown in FIG. 9, the system for loading a web page supporting multiple language further comprises following modules:

A loading module configured to load a language file, where the language file is used for storing a set of language types supported by a web page and a default language.

A language querying module configured to query a language type supported by a loaded web page in the language file loaded by the loading module.

A selecting module configured to choose a corresponding tree-shaped extensible Markup Language file set according to the language type supported by the web page chosen by the language querying module.

A dynamically translation rendering module configured to execute a code segments corresponding to respective index functions in the callback queue according to a principle that the one entering the callback queue first is executed first, where the index function is created by a corresponding code segment related to a dynamic language string in the HTML file, and the callback queue can be empty.

Further, it is understood that comparing with the method that takes the ID property of the language tag in the Hyper Text Makeup Language (HTML) file as the index key between the HTML file and the extensible Markup Language (XML) file and does not perform combining and lifting operations in the existing technical solution 1 and technical solution 2, the method of the present invention takes the name property of the language tag in the HTML file as the index key between the HTML file and the XML file and performs the operation of processing a web page supporting multiple languages (or referred to as "combining and lifting"), so that the number of language strings requiring revision is significantly reduced when a web page of high capacity switches languages or web pages are loaded, and the redundancy r % among language strings is almost zero, i.e. there is nearly no same repeated language strings which need to be revised, where the reduced amount of the language strings requiring revision is related to the number of web pages or Web pages and the number of repeated strings between the internal Web page and the Web page, taking a web page product containing 30 HTML files as an example, r % being typically up to 20%-40%.

The fourth embodiment is the method embodiment corresponding to this embodiment, and this embodiment and the fourth embodiment can be implemented in cooperation with each other. Correlated technical details disclosed in the fourth embodiment are still effective in this embodiment and will not be repeated here in order to reduce duplication. Correspondingly, correlated technical details disclosed in this embodiment can also be applied in the fourth embodiment.

It should be illustrated that relationship terms, e.g. first and second etc, only are used to distinguish one substance or operation from another substance or operation in claims and description of the present invention, rather than require or suggest that any practical relationships or orders exist between these substances or operations. Moreover, terms "including", "containing" or any other variants mean to include non-exclusive containing, so that processes, methods, objects or apparatus containing a series of elements not only include these elements but also other elements that are not clearly shown or inherent elements of these processes, methods, objects or apparatus. If there is no more limitation, elements limited by the phrase "include a" do not exclude other same elements in processes, methods, objects or apparatus containing these elements.

Although the present invention has been illustrated and described by referring to some preferred embodiments of the present invention, it should be understood by those skilled in the art that various other changes in forms and details may be made without departing from the principles and scope of the present invention.

The invention claimed is:

1. A method for loading a web page supporting multiple languages, based on a tree-shaped translation file set, where each hypertext markup language HTML file has a corresponding translation file, wherein the method includes the following steps:
 downloading a translation file corresponding to a current HTML file and all ancestor translation files corresponding to the translation file from a server;
 combining a language string in the translation file with a common language string in all the ancestor translation files of this translation file, wherein the common language string in all the ancestor translation files of this translation file is formed in processing the web page by extracting a same language string in different translation files, inserting the extracted same language string into a minimum common ancestor translation file of the different translation files, and deleting the same language string from the different translation files, and wherein the translation file and all ancestor translation files corresponding to the translation file have a hierarchical relationship in the tree-shaped translation file set; and
 inserting the combined language string to the language tag content of the HTML file or replacing the language tag content of the HTML file with the combined language string to display or switch multiple languages.

2. The method for loading a web page supporting multiple languages according to claim 1, wherein,
 the translation file is an extensible Markup Language file;
 one tree-shaped extensible Markup Language file set corresponds to one language type.

3. The method for loading a web page supporting multiple languages according to claim 1, wherein the method comprises the following steps before the step of downloading a translation file corresponding to a current HTML file and all ancestor translation files corresponding to the translation file from a server:
 loading a language file, where the language file is used for storing a set of language types supported by a web page and a default language;
 querying a language type supported by a loaded web page in the language file;
 choosing a corresponding tree-shaped extensible Markup Language file set according to the language type supported by the web page.

4. The method for loading a web page supporting multiple languages according to claim 1, wherein,
 the translation file is an extensible Markup Language file;
 the step of combining a language string in the translation file with the common language string in all the ancestor translation files of this translation file further comprises the following sub-steps:
 combining the XML file and all the ancestor XML files of the XML file into one document structure;
 scanning a key name of a language string in the combined document structure;
 inserting the scanned key name which is taken as index to the language tag content of the HTML file or replacing the language tag content of the HTML file with the scanned key name.

5. The method for loading a web page supporting multiple languages according to claim 1, wherein, the translation file is an extensible Markup Language file;
 the step of inserting the combined language string into the language tag content of the HTML file or replacing the language tag content of the HTML file with the combined language string to display or switch multiple languages further comprises the following sub-steps:
 executing code segments corresponding to respective closures in the callback queue according to a principle that the one entering the callback queue first is executed first, where the closure is created by a corresponding code segment related to a dynamic language string in the HTML file, and the callback queue can be empty.

6. A system for loading a web page supporting multiple languages, based on a tree-shaped translation file set, where each hypertext markup language HTML file has a corresponding translation file, wherein, the system includes the following modules:
 a downloading module configured to download a translation file corresponding to a current HTML file and all ancestor translation files corresponding to the translation file from a server;
 a combining module configured to combine a language string in the translation file downloaded by the downloading module with a common language string in all the ancestor translation files of this translation file, wherein the common language string in all the ancestor translation files of this translation file is formed in processing the web page by extracting a same language string in different translation files, inserting the extracted same language string into a minimum common ancestor translation file of the different translation files, and deleting the same language string from the different translation files, and wherein the translation file and all ancestor translation files corresponding to the translation file have a hierarchical relationship in the tree-shaped translation file set; and
 a translation rendering module configured to insert the combined language string combined by the combining module to the language tag content of the HTML file or replacing the language tag content of the HTML file with the combined language string to display or switch multiple languages.

7. The system for loading a web page supporting multiple languages according to claim 6, wherein, the translation file is an extensible Markup Language file;
 one tree-shaped extensible Markup Language file set corresponds to one language type.

8. The system for loading a web page supporting multiple languages according to claim 6, wherein, the system further comprises the following modules:
 a loading module configured to load a language file, where the language file is used for storing a set of language types supported by a web page and a default language;
 a language querying module configured to query a language type supported by a loaded web page in the language file loaded by the loading module;
 a selecting module configured to choose a corresponding tree-shaped extensible Markup Language file set according to the language type supported by the web page chosen by the language querying module; and
 a dynamically translation rendering module configured to execute code segments corresponding to respective index functions in the callback queue according to a principle that the one entering the callback queue first is executed first, where the index function is created by a corresponding code segment related to a dynamic language string in the HTML file, and the callback queue can be empty.

* * * * *